United States Patent [19]

Cachier et al.

[11] 4,280,110
[45] Jul. 21, 1981

[54] MILLIMETER WAVE SOURCE COMPRISING AN OSCILLATOR MODULE AND A VARIABLE-CAPACITY MODULE

[75] Inventors: Gerard Cachier; Jean Stevance, both of Paris, France

[73] Assignee: Thomson-CSF, Paris, France

[21] Appl. No.: 29,045

[22] Filed: Apr. 11, 1979

[30] Foreign Application Priority Data

Apr. 14, 1978 [FR] France ............................. 78 11059

[51] Int. Cl.³ .............................................. H03K 9/04
[52] U.S. Cl. .......................... 331/107 DP; 331/107 R
[58] Field of Search ............... 331/56, 101, 96, 107 R, 331/107 DP

[56] References Cited

U.S. PATENT DOCUMENTS 3,714,605 1/1973 Grace et al. .................. 331/107 DP Primary Examiner—David K. Moore
Attorney, Agent, or Firm—Oblon, Fisher, Spivak, McClelland & Maier

[57] ABSTRACT

A millimeter wave source, wherein an active diode, for example an avalanche diode, forming the emitter of the source is arranged opposite to a variable capacity diode, so as to have the source frequency-modulated by varying the biassing voltage of the variable capacity diode. In this source, each diode is mounted in a "module" comprising a thermally and electrically conductive support onto which a diode is in contact by one of its electrodes, the other electrode being in contact with a metallization deposited on a thick layer of dielectric material surrounding the diode. Owing to the capacitive coupling between the metallizations of both modules, the source can be frequency-modulated with a high efficiency.

5 Claims, 5 Drawing Figures

MILLIMETER WAVE SOURCE COMPRISING AN OSCILLATOR MODULE AND A VARIABLE-CAPACITY MODULE

This invention relates to a solid-state millimeter wave source into which an active semiconductor component, in the form of an oscillating diode surrounded by dielectric material, has been integrated. This dielectric material is arranged between a metallic support for the component, which also acts as a heat dissipator, and a metallisation acting both as a biassing contact and as the upper wall of a resonant cavity of which the lower wall is formed by the metallic support, whence the name of pretuned module given to this type of source by virtue of the fact that the cavity preferentially oscillates on a particular frequency.

People are frequently confronted with the problem of using a source of this type in a transmitter of which the frequency may be varied to meet certain requirements through the following operations:

modulating of the oscillation frequency of the diode either of the digital type (application to the transmission of data) or the analog type (application to range measurement by Doppler effect);

automatic adjusting of the oscillation frequency of the diode (application to telecommunications).

It has been proposed to achieve these functions by acting on the current feeding the diode using the phenomenon of the dependence of frequency upon the biassing of the diode. The disadvantages of a process such as this are numerous because the effect produced is fairly limited, particularly in the case of the afore mentioned pre-tuned module, and also difficult to control, varying from one diode to another. In addition, it is accompanied by a significant, undesirable modulation of amplitude and generally necessitates a compromise on the power output. Finally, it is incompatible with a high modulation frequency.

The present invention enables the problem mentioned above to be solved whilst, at the same time, avoiding most of the disadvantages referred to above.

According to the invention there is provided a millimeter wave source of the type comprising a first module formed by a first diode, a disc of solid dielectric surrounding the diode, a first electrode acting as support and a metallization acting as biassing electrode, the source additionally comprising biassing means enabling the first diode to function as a diode having negative resistance at high frequencies, the source further comprising a second module formed by a second diode capable of functioning as a variable-capacity diode under predetermined biassing conditions, this diode facing the diode of the first module so as to form a capacitive coupling between the metallizations of the respective modules, the source additionally comprising a conductive body acting as an electrical earth and as a mechanical support for both modules.

The invention will be better understood and other features thereof will become apparent from the following description in conjunction with the accompanying drawings, wherein:

FIG. 1 diagrammatically illustrates a source according to the invention;

Figure 1:
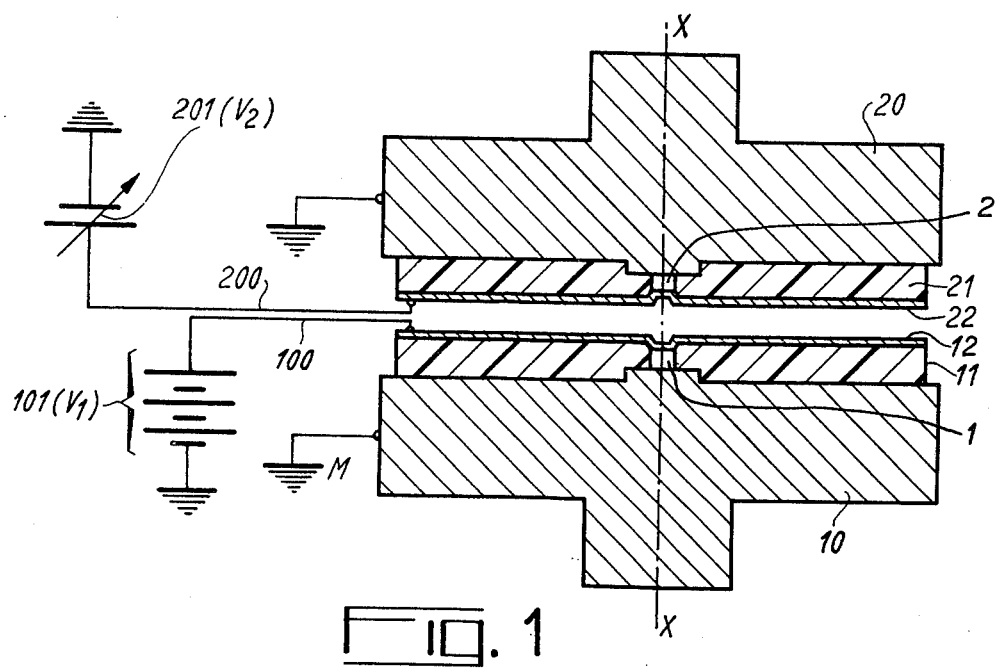
FIG. 1 shows by way of example two identical modules in a theoretical arrangement of a source according to the invention where the flat metallizations of the two modules are parallel and arranged at a narrow interval (of the order of one millimeter or less) opposite one another.

These two modules respectively comprise, on heat dissipation supports 10 and 20, diodes 1 and 2 surrounded by dielectric material (11, 21) covered by flat, circular metallizations (12, 22). These two modules are solids having a common revolution axis i.e the line XX.

A connection 100 is welded to the metallization 12 which it connects to a source 101 of d.c voltage $V_1$. The support 10 is connected to earth.

A connection 200 is welded to the metallization 22 which it connects to a source 201 of variable voltage $V_2$. The support 20 is connected to earth.

The voltage $V_1$ is designed for the diode 1 to function as an oscillator at the required power (active module).

The reference 201 denotes a variable biassing source. This variable biassing source may be formed sometimes by a feed source regulated by a potentiometer and sometimes by the output of a variable voltage modulation device. This source biasses the passive module.

One possible explanation of the phenomenon on which the invention is based is the following:

Between the two supports 10 and 20, there is a system comprising in series:

the dielectric 11 covered by the metallization 12 which is electrically connected to the support 10 through the diode 1;

an air gap;

the dielectric 21 covered by the metallization 22 which is electrically connected to the support 20 through the diode 2.

A system such as this lends itself to relatively simple calculations considering in simple terms that it consists of three microwave circuits in series, the air gap being equivalent to a coupling cavity. The result of these calculations leads to the following approximate expression in which $\Delta f$ is the deviation of the oscillation frequency when the capacity C of the variable-capacity diode is varied by $\Delta C$, the respective quality factors of the circuit and the oscillating diode being called $Q_1$ and $Q_2$:

$$(\Delta f/f) = \tfrac{1}{2}(Q_2/Q_1)(\Delta C/C)(C/C_d)$$

where $C_d$ is the capacity of the diode 1 (oscillating).

The frequency shift may reach 1 GHz for f=50 GHz.

Figure 2:
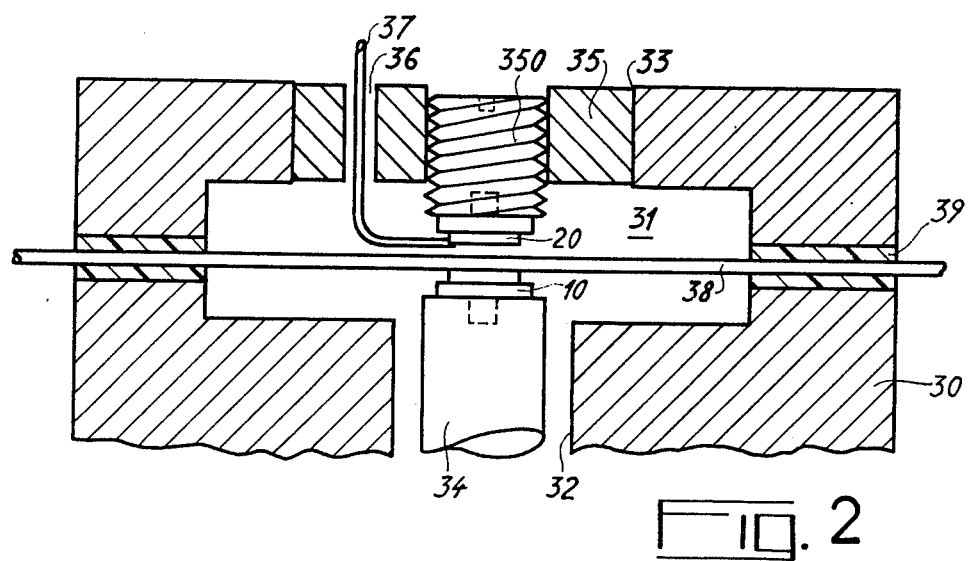
FIG. 2 illustrates one embodiment of the invention in the form of a rectangular wave guide.

In the example of embodiment illustrated in FIG. 2, a wave guide section 30 situated between two straight connecting flanges (not shown) comprises thicker walls than the rest of the wave guide, particularly on one of the large sides of the cavity 31 of rectangular cross-section.

A cylindrical positioning element 34 (partly shown) slides in a first opening 32 formed in the wall of a large side of the cavity 31, its diameter being modifiable by a spacing mechanism (not shown). A module 10 is fixed to the end of this element by a threaded spigot of its support screwed into a tapped hole in the element 34.

A second opening 33 formed in the wall of the cavity opposite the opening 32 enables an element 35 to be introduced by force. This element is traversed by a core 350 which screws in the center of the element 35. The core carries a module 20 fixed to the core 350 by a threaded spigot of its support. In addition, the element 35 comprises an opening 36 for passage of an insulated connection 37 connected by welding to the metallization of the module 20. The module 10 is biassed by contact between its metallization and a conductor 38 stretched between two passages 39 through the two lateral walls of the cavity 31.

In a first variant, the conductor 38 is omitted and the positioning and biassing system of the module 10 is replaced by a system identical with that of the module 20.

Figure 3:
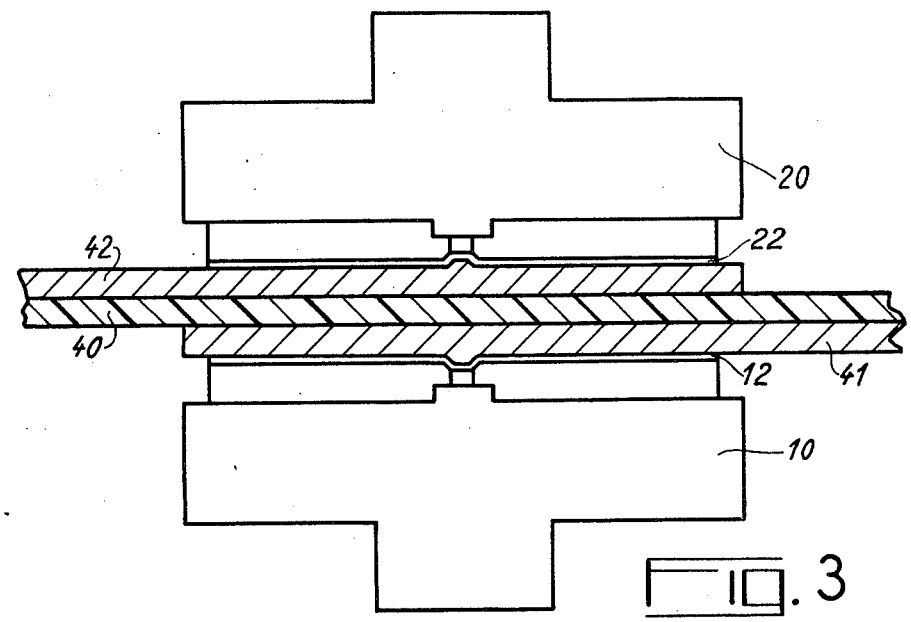
FIG. 3 shows part of a variant of the preceding embodiment.
Figure 4:
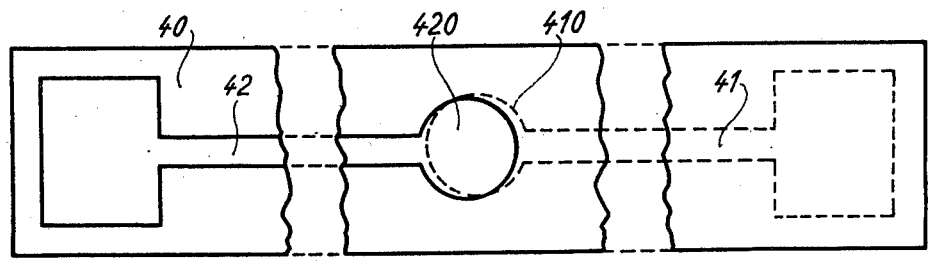
FIG. 4 is a plan view of a detail shown in section in FIG. 3.

In a second variant, a system identical with that of the module 10 is adopted for the positioning systems of the modules 10 and 20. Biassing is obtained by means of a two-face printed wiring shown in plan in FIG. 4. This printed wiring replaces the conductor 38, the passages 39 being modified accordingly. The metallizations 41 and 42 comprise circular parts 410 and 420 intended to enter into contact with the metallizations 12 and 22 (FIG. 3). Metallic discs (not shown) may be inserted between the elements 12 and 410, 22 and 420 for adjusting the central oscillation frequency.

Figure 5:
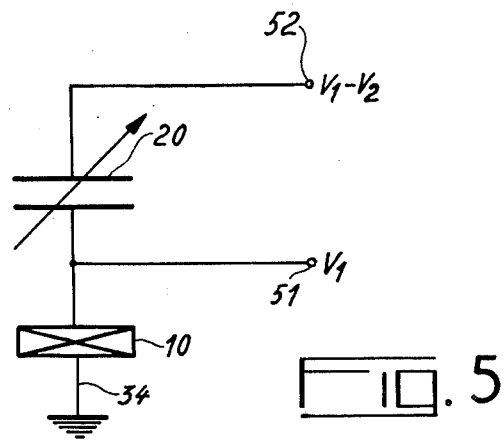
FIG. 5 is an electrical circuit diagram corresponding to another embodiment of the invention.

In a third variant, a different biassing system is adopted (FIG. 5). The module 10 is biassed by a voltage $V_1$ applied between its metallization and its earthed support. The module 20 is biassed by a potential difference $V_2$ applied between a terminal 51 at the potential $V_1$ and a terminal 52 at the potential $V_1-V_2$. Accordingly, both the metallizations of the modules are in contact with the conductor 38, so that it is possible to dispense with the opening 36 and the connection 37 in the positioning and biassing system shown in FIG. 2. In this variant, the positioning element of the module 20 has to be insulated from earth.

In a modified embodiment (not shown), the source is accommodated in a recess forming a branch of a wave guide section. The position of the source in the recess is adjustable. In addition, a plunger slidably mounted at one end of the section enables the impedance of the wave guide section to be adjusted to the location of the branch formed by the recess where the source is accommodated.

In all the embodiments described above, the wave guide may open into a directional antenna, for example a frustum forming a horn antenna.

The invention is applicable in particular to millimeter wave guides comprising an oscillating diode of the avalanche diode type. The variable-capacity diode of the module associated with the oscillating diode may possibly be formed by a semiconducting junction different from that used in the oscillating diode.

What we claim is:

1. A millimeter wave source of the type comprising a first module formed by a first diode, a disc of solid dielectric surrounding the diode, a first electrode acting as support and a first metallization acting as biassing electrode, the source additionally comprising biassing means enabling the first diode to function as a diode having negative resistance at high frequencies, the source further comprising a second module formed by a second diode capable of functioning as a variable-capacity diode under predetermined biassing conditions, variable voltage means providing said biassing conditions to said second diode, a second metallization acting as a biassing electrode, said second diode facing said first the diode of the first module so as to form a capacitive coupling between said first and second metallizations, the source additionally comprising a conductive body acting as an electrical earth and as a mechanical support for both modules.

2. A source as claimed in claim 1, wherein the conductive body includes the walls of a wave guide section in which openings are formed for the passage of positioning elements for the two modules and the biassing means.

3. A source as claimed in claim 2, wherein the first module and the second module are respectively in contact with two conductors belonging to the opposite faces of a two-face printed wiring.

4. A source as claimed in claim 1, additionally comprising wave guide section, the first module being supported by a first element positioned in a first wall of the wave guide and biassed by a first insulated conductor, the second module being supported by a second element positioned in a second wall of the wave guide and biassed by a second insulated conductor, the common electrical earth connecting the two elements and the walls of the section.

5. A source as claimed in claim 1, wherein the source is placed in an adjustable position in a recess forming a branch of a wave guide section, the wave guide section additionally comprising a mobile plunger.

* * * * *